(12) United States Patent
Reid et al.

(10) Patent No.: US 7,092,479 B1
(45) Date of Patent: Aug. 15, 2006

(54) RIPPLE COUNTER CIRCUITS IN INTEGRATED CIRCUIT DEVICES HAVING FAST TERMINAL COUNT CAPABILITY AND METHODS OF OPERATING THE SAME

(75) Inventors: David Reid, Forestville (AU); Timothy Gillespie, Beverly Hills (AU)

(73) Assignee: Integrated Device Technology, Inc., San Jose, CA (US)

( * ) Notice: Subject to any disclaimer, the term of this patent is extended or adjusted under 35 U.S.C. 154(b) by 29 days.

(21) Appl. No.: 10/931,699

(22) Filed: Sep. 1, 2004

(51) Int. Cl.
*G06F 3/00* (2006.01)

(52) U.S. Cl. .......................................... 377/28; 377/52

(58) Field of Classification Search ................ None
See application file for complete search history.

(56) References Cited

U.S. PATENT DOCUMENTS

| | | | | |
|---|---|---|---|---|
| 4,612,658 A * | 9/1986 | Eby | ........................... | 377/52 |
| 4,653,074 A * | 3/1987 | Griffin et al. | ................ | 375/354 |
| 4,741,004 A * | 4/1988 | Kane | ........................... | 377/110 |
| 4,857,758 A * | 8/1989 | Rigazio et al. | ............. | 307/140 |
| 5,060,243 A | 10/1991 | Eckert | ........................... | 377/28 |
| 5,880,644 A * | 3/1999 | Schmidt et al. | ............. | 332/109 |
| 5,952,888 A * | 9/1999 | Scott | ............................. | 331/2 |
| 6,393,088 B1 * | 5/2002 | Emineth et al. | ............. | 377/20 |

* cited by examiner

*Primary Examiner*—Timothy P. Callahan
*Assistant Examiner*—Cassandra Cox
(74) *Attorney, Agent, or Firm*—Myers Bigel Sibley & Sajovec PA

(57) ABSTRACT

Ripple counter circuits in integrated circuit devices can have fast terminal count capability. A terminal count circuit can be configured to mask selected unstable counter bits generated by a ripple counter circuit using an indication that a terminal state of the ripple counter circuit has been reached. Related methods are also disclosed.

10 Claims, 4 Drawing Sheets

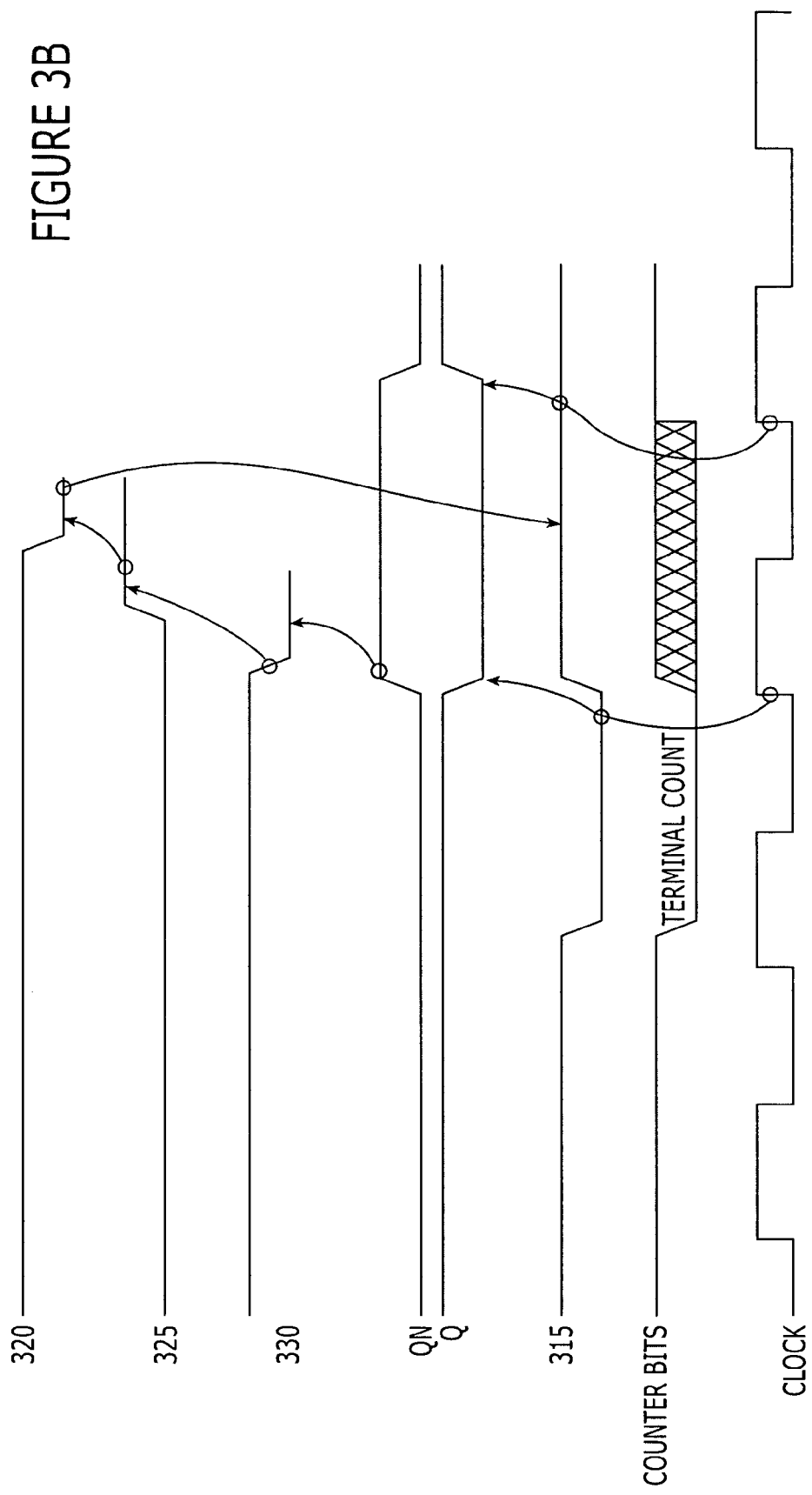

RIPPLE COUNTER CIRCUITS IN INTEGRATED CIRCUIT DEVICES HAVING FAST TERMINAL COUNT CAPABILITY AND METHODS OF OPERATING THE SAME

FIELD OF THE INVENTION

The invention relates to digital counter circuits and methods of operating the same.

BACKGROUND

Asynchronous ripple counter circuits are known to be used, for example, as frequency divider circuits. Some asynchronous ripple counter circuits include a number of synchronous state devices (such as flip-flops) connected in series so that the data output of each stage is connected to the clock input of the following stage. The asynchronous ripple counter circuit is typically driven by a clock signal, provided to the first stage or least significant bit (LSB), of the ripple counter circuit. Accordingly, the output of each of the flip-flips operates at a frequency that is one half of the frequency of the output of the preceding stage of the counter. For example, the output of the first stage (LSB) of the ripple counter transitions once in response to two transitions of the clock signal input. Similarly, the second order bit of the counter transitions once for every four transitions of the input clock signal. For this reason, asynchronous ripple counter circuits are sometimes referred to as frequency dividers. Asynchronous ripple counter circuits are further discussed, for example, in U.S. Pat. No. 5,060,243 to Eckert.

It is known that as the number of bits included in an asynchronous ripple counter circuit is increased, there is an increased likelihood that the more significant bits in the counter circuit will remain unstable for an extended period after each clock transition at the input of the counter circuit. In particular, the more significant bits of the asynchronous ripple counter circuit may transition through several intermediate states before reaching a final correct state (which actually reflects the number of clock transitions input to the ripple counter circuit). It is further known that as the frequency of the clock signal applied to the asynchronous ripple counter circuit increases, the likelihood that the more significant bits of the counter circuit will be unstable for periods subsequent to a clock signal transition also increases. As such, asynchronous ripple counters may not be suitable for high frequency applications.

SUMMARY

Embodiments according to the invention can provide ripple counter circuits in integrated circuit devices having fast terminal count capability and methods of operating the same. Pursuant to these embodiments, a terminal count circuit can be configured to mask selected unstable counter bits generated by a ripple counter circuit using an indication that a terminal state of the ripple counter circuit has been reached. In some embodiments according to the invention, the counter bits stabilize in an initial state of the ripple counter circuit.

In some embodiments according to the invention, a combinatorial circuit can be used to de-activate the indication that the terminal state has been reached by masking the state of the counter bits using the indication. In other embodiments according to the invention, the combinatorial circuit can include a first combinatorial gate that can be electrically coupled to the indication that the terminal state has been reached and configured to de-activate the indication that the terminal state has been reached. A second combinatorial gate can be electrically coupled to the indication that the terminal state has been reached and configured to mask the state of the counter bits using the indication.

In other embodiments according to the invention, a terminal count circuit can be configured to indicate a terminal state for a high frequency ripple counter circuit less than one high frequency clock period after the ripple counter circuit enters the terminal state. The high frequency ripple counter circuit can indicate the terminal state within a time interval about equal to or less than four inverter delays after receiving a clock edge for the terminal state. In some embodiments according to the invention, a combinatorial circuit can have an input electrically coupled to an output of the ripple counter circuit and an output that indicates the terminal state. A propagation delay associated with the combinatorial circuit can be less than the one high frequency clock period.

In some embodiments according to the invention, the output of the ripple counter circuit can be a least significant bit of the ripple counter circuit. In some embodiments according to the invention, the terminal count circuit can be further configured to load the ripple counter circuit with the arbitrary initial state responsive to a high frequency clock edge that is immediately subsequent in time to indication of the terminal state.

In still other embodiments according to the invention, the ripple counter circuit can be a count-down ripple counter circuit or a count-up ripple counter circuit. In some embodiments according to the invention, the high frequency ripple counter circuit can be configured to operate at a frequency range of about 2 Gigahertz. In yet other embodiments according to the invention, the high frequency ripple counter circuit can be fabricated according to a 0.2 micron process.

In further embodiments according to the invention, a ripple counter circuit can be configured to transition from an arbitrary initial count to a terminal count responsive to a series of edges of a clock signal applied thereto. A terminal count circuit can be electrically coupled to the ripple counter circuit and configured to indicate the terminal count, less than one clock period after the ripple counter circuit receives a clock edge corresponding to transition, to the terminal count.

In still other embodiments according to the invention, a high frequency ripple counter circuit can be controlled by counting clock transitions from an arbitrary initial state to a terminal state of the counter circuit to generate an indication that the terminal state has been reached based on counter bits associated with the clock transitions. Reaching the terminal state can be indicated based on the counter bits. The counter circuit can be reloaded with the arbitrary initial state and the counter bits can be masked to de-activate the indication that the terminal state has been reached.

BRIEF DESCRIPTION OF THE DRAWINGS

FIG. 3B is a timing diagram that illustrates operation of the counter circuit and terminal count circuit shown in FIG. 3A.

DETAILED DESCRIPTION OF EMBODIMENTS ACCORDING TO THE INVENTION

Figure 1:
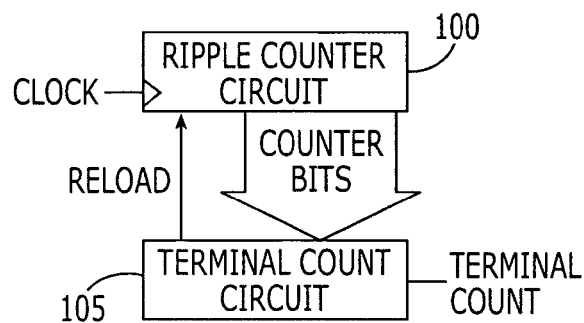
FIG. 1 is a block diagram illustrating ripple counter circuits and terminal count circuits according to some embodiments of the invention.

The invention is described more fully hereinafter with reference to the accompanying figures, in which embodiments of the invention are shown. This invention may, however, be embodied in many alternate forms and should not be construed as limited to the embodiments set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element without departing from the teachings of the disclosure.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As described herein in further detail, the terminal count circuit may operate at higher frequencies by reducing the time between when the clock edge corresponding to the terminal state is received and the assertion of the terminal state is indicated. The operational speed of the counter may also be increased by masking outputs of the counter that may be unstable for a period following the transition of a clock used to drive the counter. The masking may be used to properly indicate that the terminal count has been reached so that the ripple counter circuit may be reloaded.

FIG. 1 is a high-level block diagram of a ripple counter circuit 100 electrically coupled to a terminal count circuit 105. According to FIG. 1, the ripple counter circuit 100 can be an arrangement of clocked state devices (such as flip-flops) where the clock input of each of the state devices is connected to the data output of the state device in the preceding stage. A clock signal is electrically coupled to a least significant state device (or counter bit) in the ripple counter circuit 100.

Figure 3A:
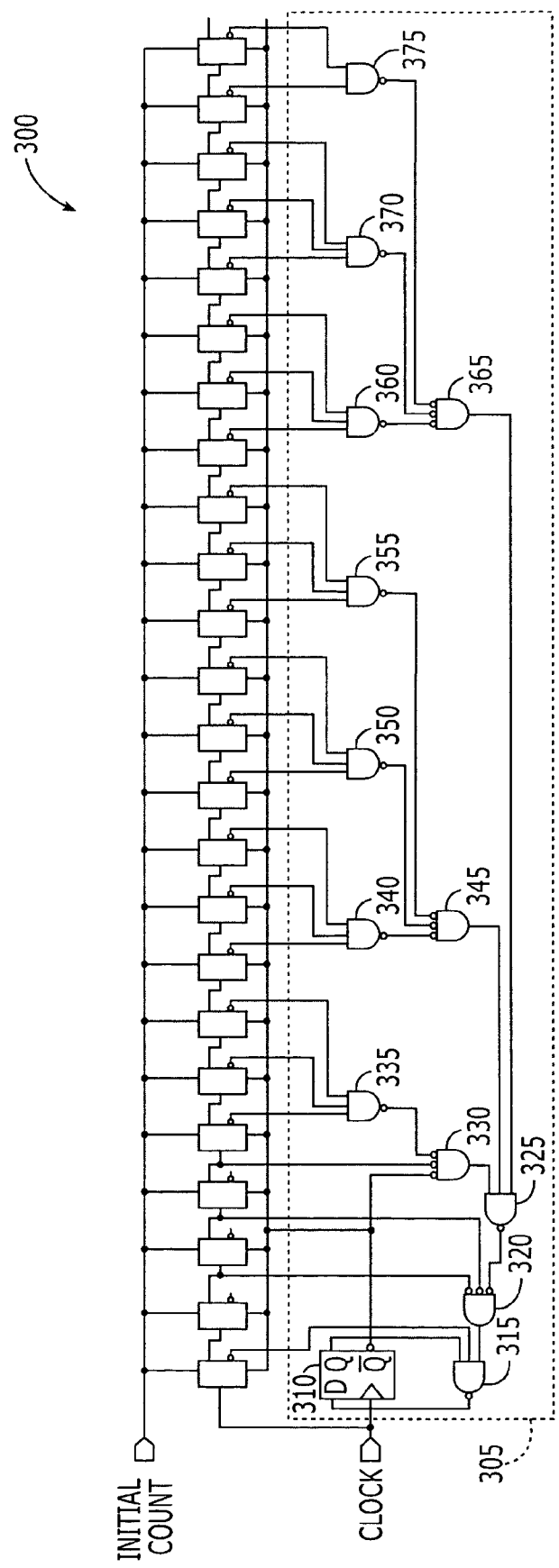
FIG. 3A is a detailed schematic diagram of a ripple counter circuit and terminal count circuit according to some embodiments of the invention.

As the clock signal transitions, the ripple counter circuit 100 "counts" the clock transitions so that each increasingly more significant stage of the ripple counter circuit 100 reflects a divide-by-two frequency indication of the stage which precedes it. In other words, each stage of the ripple counter circuit 100 provides a divide-by-two function relative to the stage's input. In some embodiments according to the invention, the ripple counter circuit can be constructed as a 24-bit counter circuit as shown in FIG. 3A.

The terminal count circuit 105 receives the counter bits from the ripple counter circuit 100 so that the terminal count circuit 105 can indicate that a "terminal state" has been reached based on the occurrence of a predetermined number of clock transitions in the ripple counter circuit 100. The ripple counter circuit 100 can proceed from an arbitrary initial state to the terminal state, where the states are reflected by the value of the counter bits provided to the terminal count circuit 105. It will be understood that as used herein the term "arbitrary" means that the initial state can be any state that can be represented by the stages of the ripple counter circuit 100.

The ripple counter circuit 100 responds to the clock signal by incrementing the counter bits by a single value. In other words, as the clock signal transitions, the counter bits are changed to reflect a binary count of the number of clock transitions provided to the ripple counter circuit 100. It will be understood that in some embodiments according to the invention, the ripple counter circuit 100 is a "count-down" counter where the initial state is greater than the terminal state. In other embodiments according to the invention, the ripple counter circuit 100 is a "count-up" counter where the initial state is less than the terminal state. It will also be understood that the ripple counter circuit 100 can include any number of bits or stages.

In operation, the terminal count circuit 105 receives the counter bits from the ripple counter circuit 100 and indicates when the predetermined terminal count has been reached by the ripple counter circuit 100, whereupon the terminal count circuit 105 indicates the terminal count and asserts the reload signal so that the ripple counter circuit 100 can be reloaded with the arbitrary initial state and a new counting cycle can begin. It will also be understood that the indication that the predetermined terminal count has been reached can be asserted within a time interval equal to or less than about four inverter gate delays where one inverter gate delay reflects a standard time delay for an input to the inverter to affect the output. The inverter gate delay is associated with the process used to fabricate the inverter or counter circuit. For example, the ripple counter circuit shown in FIG. 3A can be implemented using a 0.2 micron fabrication process, which may enable the ripple counter circuit to operate at high frequencies of about 2 Gigahertz.

The terminal count circuit 105 also deasserts the indication of terminal count by masking the counter bits so that any instability therein can be prevented from affecting the accuracy of the terminal count indication. It will be understood that the asynchronous nature of the ripple counter circuit 100 may generate instability in some of the upper level counter bits such that the indication of terminal count (if otherwise unmasked) may provide a false indication of terminal count so that the ripple counter circuit 100 may be reloaded more than once (after an otherwise accurate indication of terminal count), which may cause an inaccurate count of the overall clock signal transitions.

Figure 2A:
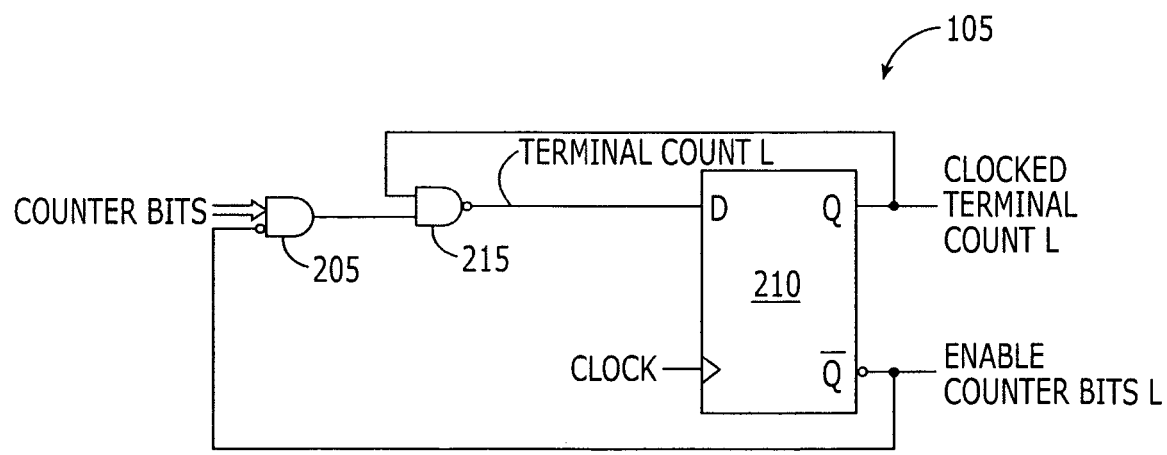
FIG. 2A is a high-level schematic diagram illustrating a terminal count circuit according to some embodiments of the invention.

FIG. 2A is a high-level schematic diagram of a terminal count circuit 105 according to some embodiments of the invention. In particular, the counter bits from the ripple counter circuit 100 are provided to combinatorial logic 205 which is also electrically coupled to an output of the flip-flop 210 labeled "Enable Counter Bits L." The output of the combinatorial logic circuit 205 is electrically coupled to an input of the combinatorial circuit 215 also having an input coupled to an output of the flip-flop 210 labeled "Clocked Terminal Count L" coupled thereto. The combinatorial logic circuit 215 provides an output labeled "Terminal Count L" to an input of the flip-flop 210, which operates synchronously on transitions of the clock signal provided thereto. It will be understood that the combinatorial logic circuits 205 and 215 can operate to mask any instability in the addressing (i.e. counter bits) after the terminal state of the ripple counter circuit 100 has been reached using Enable Counter Bits L to disable the output of the combinatorial circuit 205.

Figure 2B:
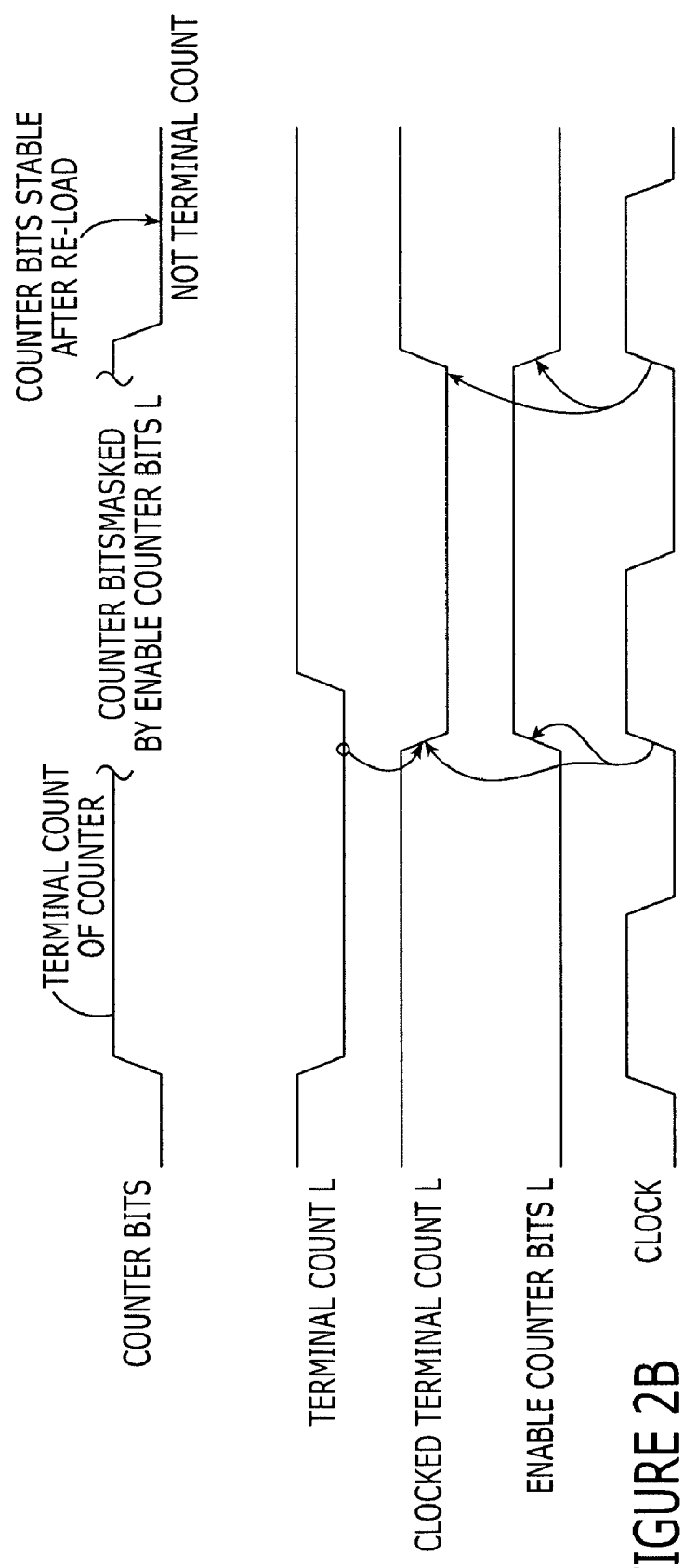
FIG. 2B is a timing diagram that illustrates high-level operation of the terminal count circuit shown in FIG. 2A.

FIG. 2B is a timing diagram that illustrates operations of the terminal count circuit shown in FIG. 2A according to some embodiments of the invention. It will be understood the clock signal is provided to both the flip-flop 210 and the ripple counter circuit 100. When the counter bits provided by the ripple counter circuit 100 indicate that the terminal count of the counter has been reached, the output of the combinatorial circuit 205 is turned on (enabled by "Enable Counter Bits L" signal being asserted). The combinatorial logic circuit 215 is also enabled causing the "Terminal Count L" signal to be asserted, which is clocked into the flip-flop 210 on the next transition clock signal to cause the "Clocked Terminal Count L" signal to be asserted. The assertion of the "Clocked Terminal Count L" signal causes the combinatorial circuit 215 to disable its output "Terminal Count L" so that "Clocked Terminal Count L" is turned off on the next clock edge. Furthermore, the "Enable Counter Bits L" signal is disabled along with the assertion of "Clocked Terminal Count L" to thereby mask the counter bits so that any instability rippling through the counter circuit 100 can be prevented from causing spurious assertions of the "Terminal Count L" signal to the input of the flip-flop 210 after the Terminal Count L signal is asserted.

FIG. 3A is a detailed schematic diagram of a ripple counter circuit 300 coupled to a terminal count circuit 305 according to some embodiments of the invention. The terminal count circuit 305 is interfaced to a 24-bit ripple counter circuit, which is configured to count-down from a loadable arbitrary initial state to a terminal state of "zero" (i.e., all bit positions of the counter circuit equal to 0). Combinatorial logic circuits 335, 340, 345, 350, 355, 360, 365, 370, and 375 are coupled to upper level bits of the counter circuit, which may be unstable after reaching the terminal state described above.

FIG. 3B is a timing diagram that illustrates operation of the terminal count circuit 305 in FIG. 3A. In operation, the clock signal is applied to a flip-flop 310 as well as the input of the first stage of the ripple counter circuit 300 shown in FIG. 3A. Upon reaching the terminal state, the counter bits are equal to zero, thereby causing the output of a combinatorial circuit 315 to be asserted low to the input of the flip-flop 310. As shown in FIG. 3B, the input to the combinatorial circuit 315 from the output Q of the flip-flop 310 is in a high state, thereby enabling the counter bits to affect the output of the combinatorial circuit 315. Likewise, an output of a combinatorial circuit 330 is also enabled by an output QN (sometimes referred to as Qbar) from the flip-flop 310 so that counter bits from the counter circuit can be enabled through combinatorial circuits 325 and 320 to the combinatorial circuit 315. It will be understood that the term Q refers to a logically true output of a flip-flop, whereas the term QN refers to a logically false output of a flip-flop (which is the complement of the Q output of the same flip-flop).

The output of the combinatorial circuit 315 is clocked to the output Q of the flip-flop 310 so that the inputs of the combinatorial circuit 315 are disabled thereby causing the input to flip-flop to be high (and subsequently clocked through to the output on the next clock edge). When the output Q of the flip-flop 310 is brought low, the output QN of the flip-flop 310 is also brought high to disable the output at combinatorial circuits 330 and 325 thereby masking instability in the counter bits after the terminal state has been reached. Masking of the outputs of the upper counter stages can provide a stable input to combinatorial circuit 315 so that the output Q of flip-flop 310 remains in the high state on subsequent edges of the clock until the upper counter bits have stabilized.

As described herein, a terminal count circuit may operate at higher frequencies by reducing the time between when the clock edge corresponding to the terminal state is received and the assertion of the terminal state is indicated. The operational speed of the counter may also be increased by masking outputs of the counter that may be unstable for a period following the transition of a clock used to drive the counter. The masking may be used to properly indicate that the terminal count has been reached so that the ripple counter circuit may be reloaded.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. An integrated circuit device comprising:
  a terminal count circuit configured to mask selected unstable counter bits generated by a ripple counter circuit using an indication that a terminal state of the ripple counter circuit has been reached, wherein the terminal count circuit comprises a combinatorial circuit having a first input electrically coupled to an output of the ripple counter circuit and second input electrically coupled to a clock delayed terminal count indication, the combinatorial circuit further comprising an output that indicates the non-terminal state, wherein a propagation delay associated with the combinatorial circuit is less than the one clock period.

2. A circuit according to claim 1 wherein the counter bits stabilize in an initial state of the ripple counter circuit.

3. A circuit according to claim 1 wherein the counter bits comprise upper counter bits that are unstable for more than one clock period after a clock edge used to increment the ripple counter circuit.

4. A circuit according to claim 1 wherein the terminal count circuit further comprises:
  a combinatorial circuit configured to de-activate the indication that the terminal state has been reached by masking the state of the counter bits using the indication.

5. A circuit according to claim 4 wherein the combinatorial circuit comprises:
  a first combinatorial gate electrically coupled to the indication that the terminal state has been reached and configured to de-activate the indication that the terminal state has been reached; and a second combinatorial gate electrically coupled to the indication that the terminal state has been reached and configured to mask the state of the counter bits using the indication.

6. A circuit in an integrated circuit device comprising:

a terminal count circuit configured to indicate a terminal state for a high frequency ripple counter circuit less than one high frequency clock period after the ripple counter circuit enters the terminal state;

wherein the terminal count circuit is further configured to load the ripple counter circuit with an arbitrary initial state responsive to a high frequency clock edge that is immediately subsequent in time to the indication of the terminal state;

wherein the terminal count circuit is further configured to change the indication of the terminal state to a non-terminal state responsive to the high frequency clock edge that is immediately subsequent in time to the clock edge in which the ripple counter circuit enters the terminal state; and wherein the terminal count circuit comprises a combinatorial circuit having an input electrically coupled to an output of the ripple counter circuit and a clock delayed terminal count indication and having an output that indicates the non-terminal state, wherein a propagation delay associated with the combinatorial circuit is less than the one clock period.

7. A circuit in an integrated circuit device comprising:

a terminal count circuit configured to indicate a terminal state for a high frequency ripple counter circuit less than one high frequency clock period after the ripple counter circuit enters the terminal state;

wherein the terminal count circuit comprises a combinatorial circuit having an input electrically coupled to an output of the ripple counter circuit and having an output that indicates the terminal state, wherein a propagation delay associated with the combinatorial circuit is less than the one high frequency clock period;

wherein the combinatorial circuit comprises a first combinatorial circuit, further comprising:

a second combinatorial circuit having an input electrically coupled to an output of the ripple counter circuit other than a least significant output thereof and a clock delayed terminal count indication and having an output electrically coupled to the input of the first combinatorial circuit, wherein a propagation delay associated with the second combinatorial circuit is greater than the propagation delay associated with the first combinatorial circuit.

8. A circuit according to claim 7 wherein the output of the ripple counter circuit other than the least significant bit output thereof comprises at least one upper bit of the ripple counter circuit.

9. A circuit according to claim 8 wherein the least significant output comprises a bit of the ripple counter circuit that remains stable for at least one period after a clock edge that is immediately subsequent in time to indication of the terminal state.

10. A method of controlling a high frequency ripple counter circuit comprising:

counting clock transitions from an arbitrary initial state to a terminal state of the counter circuit to generate an indication that the terminal state has been reached based on counter bits associated with the clock transitions;

indicating that the terminal state has been reached based on the counter bits;

re-loading the counter circuit with the arbitrary initial state; and masking the counter bits to de-activate the indication that the terminal state has been reached by indicating a non-terminal state to the counter circuit with an output of a combinatorial circuit in a time that is less than or equal to one clock period used to operate the counter circuit measured from a time at which a terminal state indication is provided to the combinatorial circuit to a time at which the non-terminal state is indicated.

* * * * *